US005353433A

United States Patent [19]
Sherman

[11] Patent Number: 5,353,433
[45] Date of Patent: Oct. 4, 1994

[54] METHOD AND APPARATUS FOR ORGANIZING AND ANALYZING TIMING INFORMATION

[75] Inventor: Steven K. Sherman, Marlborough, Mass.

[73] Assignee: Digital Equipment Corporation, Maynard, Mass.

[21] Appl. No.: 578,723

[22] Filed: Sep. 6, 1990

[51] Int. Cl.$^5$ .............................................. G06F 15/60
[52] U.S. Cl. ..................................... 395/550; 364/480; 364/488; 364/578
[58] Field of Search ............... 364/480, 578, 488, 489; 395/550

[56] References Cited

U.S. PATENT DOCUMENTS

| | | | |
|---|---|---|---|
| 4,527,249 | 7/1985 | Van Brunt | 364/578 |
| 4,763,289 | 8/1988 | Barzilai et al. | 364/578 |
| 4,965,758 | 10/1990 | Sherman | 364/578 |
| 5,095,454 | 3/1992 | Huang | 364/578 |
| 5,126,966 | 5/1992 | Hafeman et al. | 364/500 |
| 5,212,783 | 5/1993 | Sherman | 395/550 |

OTHER PUBLICATIONS

Kara et al., "Antonate Timing Design", *IEEE Design & Text of Computers*, 1988 pp. 28–40.
Sherman, Steven, "Algorithms for Timing Requirement Analysis and Generation", ACM/IEEE paper 43.6, 1988 pp. 724–727.
McWilliams, *Verification Of Timing Constraints On Large Digital Systems* (Ph.D. Thesis submitted May 1980).
Jahanian & Mok, *A Graph–Theoretic Approach For Timing Analysis And Its Implementation* (1987).
Dasarathy, *Timing Constraints Of Real–Time Systems: Constructs For Expressing Them, Methods Of Validating Them* (1985).
Bartlett, Cohen, DeGeus & Hachtel, *Synthesis And Optimization Of Multi–Level Logic Under Timing Constraints* (1985).
Camposano & Kunzmann, *Considering Timing Constraints In Synthesis From A Behavioural Description* (1986).
Alali & Landrault, *SIMFLO: A Symbolic Simulation For Timing Constraints Verification* (publication date unknown).

Primary Examiner—Dale M. Shaw
Assistant Examiner—D. Dinh
Attorney, Agent, or Firm—Cesari and McKenna

[57] ABSTRACT

A method and apparatus for analyzing signal timing requirements in complex electronic systems. The invention accepts from the user a set of specifications that express timing constraints, and generates therefrom a set of self-consistent "dependences" that relate signal locations to one another in terms of the minimum or maximum time that must elapse between such locations. The invention also generates signal pattern information that establishes the states of the various signals involved at different relevant times, and can be used to produce a signal profile.

7 Claims, 16 Drawing Sheets

PERIOD SECOND HALF MIN CALCULATION

PERIOD FIRST HALF MAX CALCULATION

PERIOD SECOND HALF MAX CALCULATION

PULSE WIDTH GENERATION

METHOD AND APPARATUS FOR ORGANIZING AND ANALYZING TIMING INFORMATION

BACKGROUND OF THE INVENTION

A. Field of the Invention

The present invention relates to electronic design, and more particularly to analysis of signal timing requirements in complex electronic systems.

B. Description of the Prior Art

Digital processing systems typically consist of a combinational logic network and bistable latch elements. The combinational logic network contains a large number of logic components that perform decision-making functions, while the latches serve as memory elements to temporarily store input, intermediate and output data, as well as control information. A clocking system mediates communication among the system components and state changes in the individual elements; usually, the state of the system changes at the occurrence of each clock pulse.

Components and groups of components have timing requirements that derive from specific operational features. Some requirements arise from hardware limitations; for example, a component may require establishment of a stable input signal for a certain minimum time interval before a stable output signal from that component can be achieved. Other requirements arise from system features such as bus characteristics, interface protocols or cycle times. Given the large number of interrelated timing requirements likely to be encountered in the design of even modest digital systems, methods of identifying and resolving timing conflicts are critical.

Two such methods are described in copending application Ser No. 162,624 U.S. Pat. No. 4,965,758 and Ser. No. 205,811 U.S. Pat. No. 5,218,783 (both of which are commonly owned with the present application and are hereby incorporated by reference) The '624 application describes identification of an optimized, reduced set of consistent timing requirements that deviates minimally from the set originally proposed by the user. This is accomplished by representing related timing constraints as a tree, with the the events specified in the constraint serving as vertices and the associations among such events serving as arcs.

The '811 application describes adjustment of dependences to accommodate conflicting timing requirements. As in the '624 application, timing constraints are represented as a set of arcs and vertices. The invention of the '811 application is directed toward identifying and resolving relationships among sets of constraints that graphically appear as cycles. If the constraints in a cycle impose inconsistent timing requirements, the invention identifies which constraints are most easily modified to render the cycle self-consistent. See also Sherman, *Algorithms for Timing Requirement Analysis and Generation*, Proc. of 25th ACM/IEEE Design Automation Conf. at 724 (1988).

Unfortunately, engineers rarely encounter system or component timing constraints expressed directly. Instead, they must usually infer constraints among the various signals from individual timing requirements, or "specifications", of each component or system characteristic. For example, the read-write cycle of a static random-access memory (RAM) device typically includes minimum address-line and data-line setup times, a hold time, and a maximum valid data time; these constraints ultimately relate data, address and clock signals to one another, but each concerns only a specific interval.

The difficulty of translating these individual requirements into an overall picture of signal interactions is considerable. Timing requirements suggest, but do not define, pattern characteristics of the signals to which they relate. Yet knowledge of these pattern characteristics may be critical for determining compatibility among requirements that affect the same signals, or for understanding relationships among the requirements. Like pieces of a large puzzle, individual timing requirements must be assembled into a self-consistent aggregate before compatibility issues can even be reached; unlike a puzzle, however, timing requirements must relate to the underlying signals as well as to each other.

C. Objects of the Invention

Accordingly, it is an object of the present invention to organize and relate timing constraints based on user-provided timing specifications.

It is another object of the invention to generate signal patterns based on such timing specifications.

It is a further object of the invention to determine compatibility among numerous system and/or component timing constraints and signal characteristics.

D. Definitions

As used herein, the following terms have the meanings indicated opposite and with reference to FIG. 1:

State - Represents the condition of a node in an electrical system.

Non-Transition State - In the timing diagram depicted in FIG. 1, non-transition states are designated by reference numerals 20, 22, 24, 26 and 28. A non-transition state can be logic level zero (states 20, 24 and 26), logic level 1 (states 22, 28), stable or high impedance.

Transition State - Represents the boundary between sequential non-transition states in a signal. In FIG. 1, transition states are designated by reference numerals 30, 32 and 34. A transition state can be rise (zero-to-one transition states 30 and 34), fall (one-to-zero transition states 32), rise-fall or change. "Rise-fall" denotes an indeterminate transition state between two non-transition states and can include zero-to-one, one-to-zero and no-change. "Change" is similar to rise-fall but can also include transition to a high impedance state.

Transition - Represents a boundary between states. Transitions are denoted collectively in FIG. 1 by reference numeral 38.

Signal - Denotes a named sequence of states, e.g., signals A and B in FIG. 1.

Timestamp - Denotes an absolute time value signifying when a transition will occur. Timestamps are denoted as $t_1$ through $t_6$ in FIG. 1.

Pattern - Denotes a set of signals with timestamps.

Dependence - Denotes a minimum or maximum time between transitions on the same or different specified signals (i.e., a timing constraint), and the importance of the constraint. For example, it may be necessary for the interval between $t_4$ and $t_5$ to assume or exceed a minimum critical value to permit reliable capture of signal data. A dependence can also have "polarity", meaning that the time can be expressed as a positive or negative number.

Specification - Describes timing relationships among signals with less specificity than that found in a dependence.

Dependence Connection - Establishes the transition or transitions on a pattern or patterns to which a particular dependence relates.

Site - The transition or transitions of a dependence connection.

E. Data Fields

The invention organizes information into various fields for different purposes. Each field contains several categories, and a field entry consists of data corresponding to each category. For clarity of presentation, the data fields used in the present invention are set forth below; the meaning and usage of each field will be discussed in greater detail infra.

A specification file is an ordered arrangement of the following data:

Specification Description: The basic timing-constraint information supplied by the user. Specification criteria may be derived from product literature or predetermined design criteria, and refer to at least one signal to establish the constraint.

Specification Name: In the preferred embodiment, each specification is encoded based on a standard convention, thereby allowing the invention to attach meaning to the information.

Min. Expression (optional): Minimum time between transitions.

Max. Expression (optional): Maximum time between transitions.

Typ. Expression (optional): Typical time between transitions.

The minimum, maximum or typical times denote a finite timing interval that characterizes the constraint. These intervals may be positive or negative, and are thus vector quantities in the sense that they denote both an absolute magnitude and a direction. For ease of presentation, the three types of expression are hereinafter referred to as "comparison expressions".

In one embodiment, the invention is used in conjunction with a natural-language analysis device that converts specification information entered by the user into a standard symbolic code that may be readily analyzed by a computer; such a device is described in copending application Ser. No. 7/544,269 entitled Method and Apparatus for Interpreting and Organizing Timing Specification Information, filed Jun. 26, 1990 and commonly owned with the present application and hereby incorporated by reference. In this embodiment, the user's information is treated as the Specification Description, and the symbolic code generated by the invention of the '269 application is stored as the Specification Name. Specifically, the '269 application describes parsing the user's input with a lexicon that reflects conventions typically utilized to express timing information, and using the results of the parse to select an appropriate Specification Name.

Alternatively, the user may enter a symbolic Specification Name directly. It is also possible to eliminate the Specification Name category entirely, but it will then be necessary to repeatedly analyze the description for meaning each time it is invoked.

As a simple example, the user might specify the timing constraint $t_4 \rightarrow t_6$ in FIG. 1 as a setup time with a 10 ns minimum interval. Utilizing the conventions discussed in the '269 application, the specification file entry would appear as:

| Name | Description | Min | Max | Typ |
|---|---|---|---|---|
| TBHAL | Setup Time, B high to Clock A Low | 10 | — | — |

The specification database contains the following additional categories of information relating to each specification:

From Signal: The name of the first signal to occur in the specification (in the above example, this would be B).

To Signal: The name of the last signal to occur in a specification (in the above example, this would be A).

From Prev: The state previous to a transition in a "from" signal. In FIG. 1, the state previous to B=high logic level is B=low logic level; however, this cannot be inferred from the information furnished by the user in the above example.

To Prev: The state previous to a transition in a "to" signal. In FIG. 1, the state previous to A=low logic level is A=high logic level. Again, this cannot be inferred from the information furnished by the user in the above example.

From Current: The state following a transition in a "from" signal (in the above example, this would be B=high logic level).

To Current: The state following a transition in a "to" signal (in the above example, this would be A=low logic level).

Same Signal: True if the specification always relates states within the same signal.

Diff. Signal: True if the specification always relates states within different signals.

Type: Max or min

Classification: The specification to which the dependence relates is assigned a timing classification; in one embodiment, this classification is determined in accordance with the JEDEC 100 Standard based on the user's specification description.

In operation, the invention enters data into as many of these categories as possible based on analysis of the entered specification description; the user is also free to provide this information directly. To the extent possible, the invention derives entries for unfilled categories from specifications based on known characteristics of different signal types. In the above example, "setup time" implies (i) a "To Prev." state of rise-fall (i.e., the pre-transition state can take any value except high impedance), (ii) that the specification will always relate to states within different signals, and (iii) the necessity of a min. expression.

Other information implied by specification classifications is summarized in the following table, where "X" entries denote non-transition states other than high impedance (i.e., high, low or stable), "Z" entries denote high-impedance states, and "S" entries denote stable states:

TABLE 1

| from prev | from current | to prev | to current | same signals | diff signals | type | user | classification declared |
|-----------|-------------|---------|-----------|--------------|--------------|------|------|------------------------|
| 0 or S | 1 | — | — | 1 | 0 | — | — | Rise |
| 1 or S | 0 | — | — | 1 | 0 | — | — | Fall |
| — | 0 or 1 | X | — | 1 | 0 | — | — | Cycle |
| X | X | X | X | 1 | 0 | — | 1 | Cycle (no valid signal) |
| Z | X | X | Z | 1 | 0 | — | — | Pulse Width |
| X | Z | Z | X | 1 | 0 | — | — | Pulse Width |
| S | S | S | S | 1 | 0 | — | — | Pulse Width |
| 0 | 1 | 1 | 0 | 1 | 0 | — | — | Pulse Width |
| 1 | 0 | 0 | 1 | 1 | 0 | — | — | Pulse Width |
| 0 | 1 | X | — | 0 | 1 | min | — | Hold |
| 1 | 0 | X | — | 0 | 1 | min | — | Hold |
| — | X | 0 | 1 | 0 | 1 | min | — | Setup |
| — | X | 1 | 0 | 0 | 1 | min | — | Setup |
| 0 | 1 | X | Z | 0 | 1 | — | — | Disable |
| 1 | 0 | X | Z | 0 | 1 | — | — | Disable |
| 0 | 1 | Z | X | 0 | 1 | — | — | Enable |
| 1 | 0 | Z | X | 0 | 1 | — | — | Enable |
| X | X | X | X | 0 | 1 | min | — | Valid |
| X | X | X | X | 0 | 1 | max | — | Access |
| X | X | — | X | 0 | 1 | min | 1 | Recovery |
| — | — | — | — | — | — | max | 1 | Refresh |
| — | — | — | 0 | 0 | 1 | min | 1 | Precharge |
| — | — | — | 1 | 0 | 1 | min | 1 | Precharge |
| — | — | X | X | 0 | 1 | — | — | Propagation |
| — | — | X | X | 0 | 1 | — | — | Propagation Delay |

The specification database entry for the above example would be as follows:

| From Prev. | From Current | To Prev. | To Current | Same Signals | Diff Signals | Type | Classif. |
|------------|--------------|----------|-----------|--------------|--------------|------|----------|
| 1 | | | | 0 | 0 | 1 | Min Setup |

A pattern file describes a signal by specifying its states at various timestamps. In the preferred embodiment, all relevant signals are arranged on a two-dimensional matrix, with a state entered for each signal at each listed timestamp value. Timestamp values are provided for all signals wherever a transition occurs in any signal. Thus, the number of timestamps determines the size of the matrix along one dimension (the number of signals defining the size of the other dimension), and each signal will probably have fewer transition-state entries than non-transition-state entries (since signals are generally found in stables states more often than in transition states). The pattern file for signals A and B in the above example would appear as follows, with actual numbers replacing the timestamp variables:

| Timestamps | Signal A | Signal B |
|------------|----------|----------|
| $t_1$ | R | 0 |
| $t_2$ | 1 | 0 |
| $t_3$ | 1 | R |
| $t_4$ | 1 | 1 |
| $t_5$ | F | 1 |
| $t_6$ | 0 | 1 | where R refers to a Rise transition state and F denotes a Fall transition state.

If desired, the data contained in pattern files can be translated into graphic depictions of signal profiles.

A dependence file relates timing-constraint information to specific, numbered transitions within a pattern. This information comprises the name of the dependence, the type of dependence (minimum or maximum interval), the value of the timing interval, designation of two signal transitions, and a priority attribute that defines the criticality of the dependence. This latter value assumes importance as conflicts among timing requirements are detected; in the preferred embodiment, four levels are provided: force (highest importance), attempt, check (least importance), and solve (unspecified).

As discussed below, during the initial stages of operation the invention ignores rise and fall times (namely, $t_1 \rightarrow t_2$, $t_3 \rightarrow t_4$, and $t_5 \rightarrow t_6$), and thus transitions refer only to boundaries between stable states (for clarity, these preliminary transitions will be referred to as "state boundaries"). Consequently, dependence files refer to signals with profiles such as that depicted in FIG. 2, which represents a suitably truncated version of the signals shown in FIG. 1. The first state boundary on Signal A occurs at $t_1$ and is labeled A 1 (the letter designating the signal name and the number identifying the transition); the second occurs at $t_5$ and is labeled A 2. The first and only state boundary on Signal B occurs at $t_3$, and is labeled B 1. Assuming the dependence is necessary to proper component operation and therefore merits a priority of "force", the dependence file for the above specification example is:

| Name | Type | Value | From | To | Priority |
|------|------|-------|------|-----|----------|
| TBHAL | Min | 10 | B 1 | A 2 | Force |

Note that the specification itself does not contain sufficient information to generate the dependence file; pattern and priority information must be added.

Transition numbering does not begin at the first transition in a pattern. Rather, for uniformity in designating dependences, the state of the signal at its starting time is considered a transition; it is referred to as the "zero transition" to emphasize that it is not a transition at all, but rather a state which serves as a placeholder to facilitate dependence attachment.

II. Description of the Invention

A. Brief Summary of the Invention

The present invention analyzes specification information to produce a self-consistent set of dependence and pattern files for the various signals enumerated in the specifications. If a group of dependences are incompatible with one another, this condition is reported to the user. The invention attempts to identify one or more dependences whose types and priorities permit adjustment of their timing intervals to make the group self-consistent. If no such dependences can be identified, the user is informed that the invention has found an unresolvable timing conflict.

Specification data may be provided to the system of the present invention in any format, so long as the system is able to derive meaning from the chosen representation. As hereinabove noted, computational efficiency is enhanced if the specification is expressed in symbolic form according to a consistent classification system; this permits straightforward generation of entries in the specification database, and simple cross-reference to dependences. However, because of the range of options available to the designer, the remainder of this discussion simply presumes that specification information is provided to the system in a comprehensible format.

The invention first "extracts" dependence information from the entire set of user-provided specifications and/or pattern information, and sets up preliminary dependence and pattern files. The extraction process involves analyzing the specifications for internal consistency, and designating suitable sites within the emerging signal pattern files to accommodate the dependences implied by the specifications. Pattern files are initially constructed from information contained in the specifications; however, it is likely that this data will prove insufficiently detailed to fully designate the necessary pattern information. Consequently, the invention employs various heuristic procedures that "construct" provisional signal patterns based on typical signal characteristics, and then tests the constructed patterns against the dependences for adequacy.

The pattern files created during the extraction process contain neither timestamps nor transition states; rather, at this stage, dependence file entries refer only to state boundaries between non-transition states. This strategy preserves flexibility, because individual specifications do not necessarily designate specific transition states. Furthermore, the invention only replaces the state boundaries of a dependence with transition states when required to do so by other timing requirements relating to the dependence.

After all specifications have been expressed (or "instantiated") in eligible pattern sites and appear in at least one dependence, the invention preferably replaces, where appropriate, the state boundaries of the pattern files with transition states. Basically, transition-state insertion is indicated where the boundary between two non-transition states is connected to one or more dependences that can occur earlier and to one or more dependences that can occur later.

Finally, the dependences are adjusted so as to be connected to the first or second transition of the respective transition states. After this procedure is completed, the dependence files contain references to specific transitions that have been introduced into the pattern files.

B. Brief Description of the Drawings

The foregoing discussion will be understood more readily from the following detailed description of the invention, when taken in conjunction with the accompanying drawings, in which.

Figure 26:
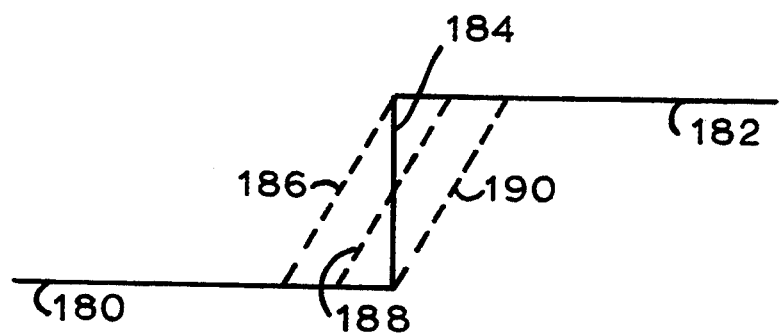

FIG. 26 exemplifies the mechanics of transition-state insertion and arbitration; and FIGS. 27-30 illustrate rules for arbitrating connection of a dependence to the first or second transition of a transition state.

C. Detailed Description of the Invention

1. Preliminary Analysis

Figure 1:
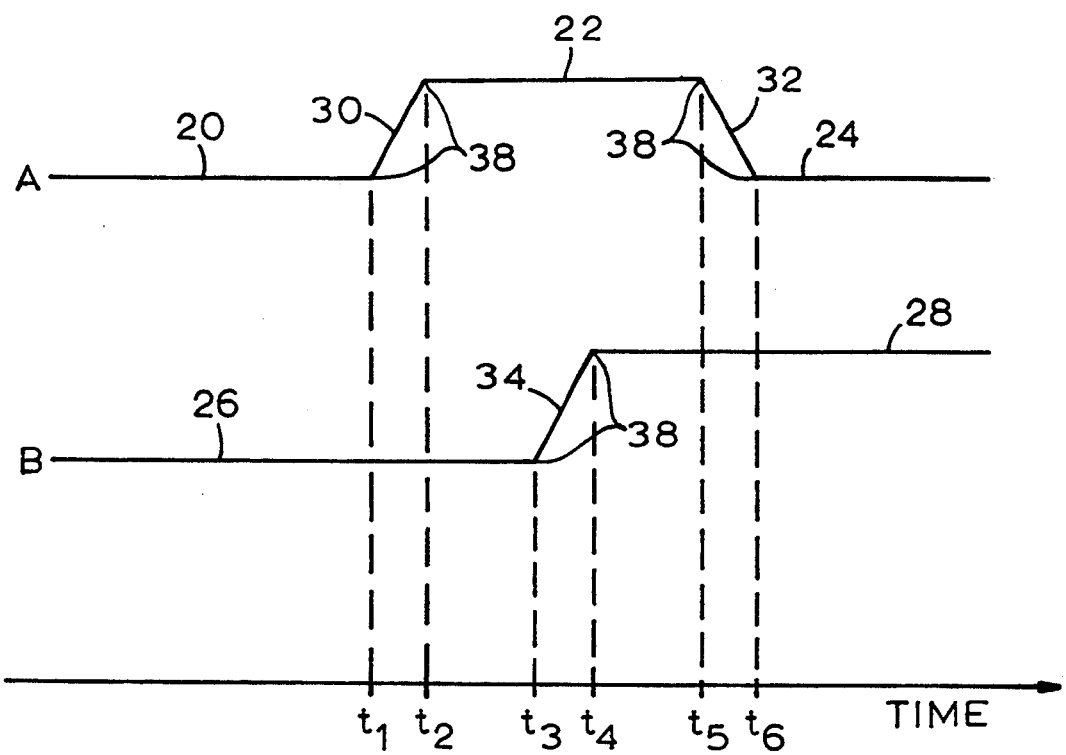
FIG. 1 illustrates timing attributes of two sample signals.
Figure 2:
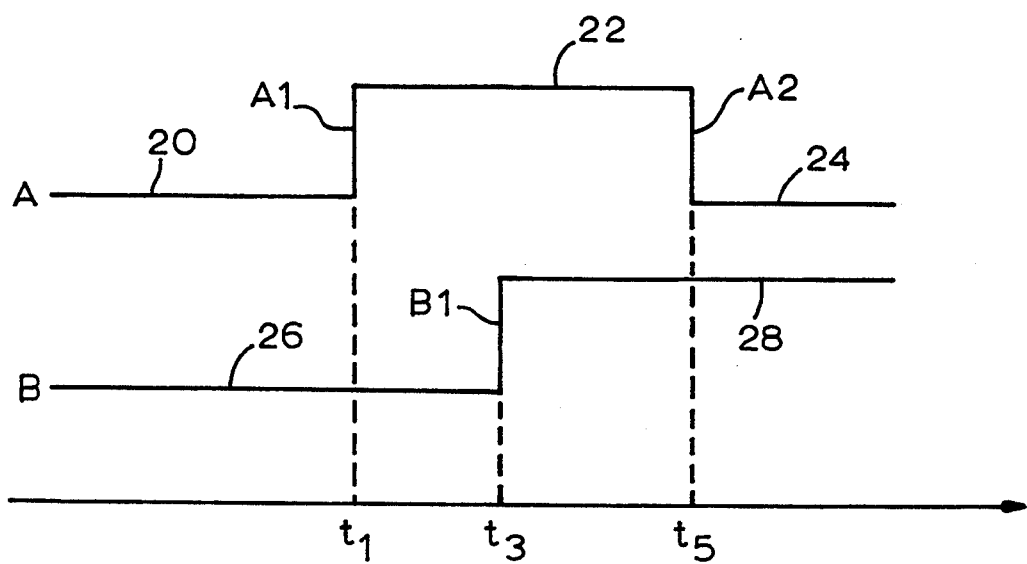
FIG. 2 is a truncated version of the signals illustrated in FIG. 1, with transition states replaced by state boundaries.
Figures 3, 4:
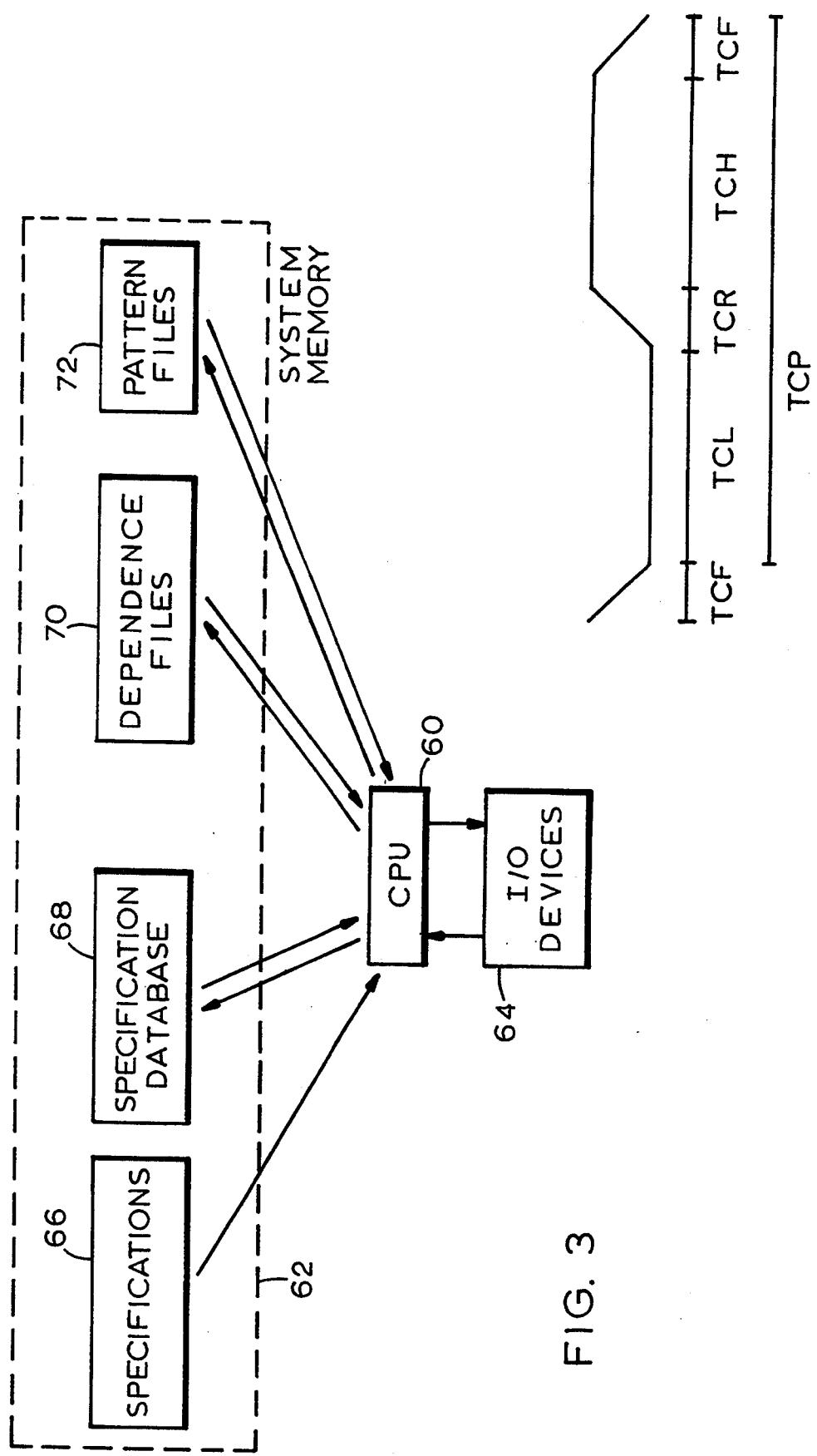
FIG. 3 is a schematic depiction of an apparatus suitable for carrying out the present invention.
FIG. 4 illustrates the timing attributes of a typical clock signal.

Refer to FIG. 3, which schematically illustrates the components of a system for conveniently practicing the present invention. As shown therein, the various data are most advantageously managed using a digital computer, which includes a central-processing unit (CPU) 60, a system memory bank 62 with which CPU 60 communicates, and one or more input/output (I/O) devices 64 that facilitate interaction with a user. System memory 62 contains locations for storing the specifications 66, the specification database 68, the dependence files 70, and the pattern files 72. For purposes of this discussion, specifications 66 (if any) are presumed to have been introduced into system memory 62 in a format suitable for analysis and classification by CPU 60.

CPU 60 initially reviews the information provided by the user, who is free to enter specifications, dependence data and/or pattern data. Ordinarily, the user will have entered at least several specifications, and CPU 60 first analyzes these to create the specification database 68. CPU 60 then examines the entries thereof to create a list of signals classified as clock, data or control signals, and the logic state associated with the asserted condition for each control and clock signal. This information should be implicit within the specifications. Finally, CPU 60 creates an individual pattern file 72 for each identified signal.

To the extent that the user has also entered pattern information, CPU 60 removes all transition states other than the first and last from each of the user's pattern files. If the user has entered dependence files, the invention retains this information and inserts state boundaries in the corresponding pattern files. Preferably, the invention also performs a preliminary analysis on any user-provided dependences that includes assignment of priorities and resolution of conflicts. Basically, dependences between two clock signals or within a clock signal are assigned a "force" priority, while all others are set to "attempt". However, if the entered dependences include a clock period and also one or more pulse widths, the period dependence is set to "force" and pulse widths other than the first within the period are set to "check".

Conflict resolution among the entered dependences is performed in accordance with the method set forth in the '811 application. If non-zero cycles (or "loops") cannot be resolved as discussed in the '811 application, the invention informs the user that the dependences in the cycle cannot coexist.

2. Extraction

Extraction involves the following operations: (i) adding state information to the pattern files based on specification data; (ii) based on this information, identifying suitable sites for instantiation of the specifications, and entering the sites into dependence files; and (iii) analyzing the dependences for consistency with one another. These operations are not performed separately, but rather in an iterative fashion by which information is gradually accumulated and analyzed.

The extraction process is organized around a series of "search modes" that detect ambiguity among specifications, and a series of control procedures that resolve the ambiguities by adding appropriate pattern information. This pattern information enables accommodation of the conflicting specifications, and serves as the basis for an entry in the dependence file corresponding to the specification. In this way, both the pattern and dependence files are augmented, and these augmented files themselves provide a greater source of signal information against which to check for further ambiguities. Accordingly, all search modes are applied twice, so that the second application takes full advantage of the information generated by the first application.

The ten search modes actually represent five different types of tests, each applied in two ways. First, in the "initial instantiation" phase, a test is applied to identify the first suitable site for instantiation of the subject specification; then, in the "further instantiation" phase, the same test is applied to all pattern sites to determine the availability of additional sites.

During each search of specification database 68, CPU 60 analyzes entries for any of four types of ambiguity. Detection of an ambiguity triggers execution of a control procedure to produce a solution, which generally results in addition of information to the pattern files. Preferably, after the search modes are executed, a final compatibility test is performed on the generated dependences to assure compatibility. Such a procedure is described in the '811 application, and involves identifying dependence cycles, determining whether the dependences within each cycle conflict, and designating dependences eligible for conversion to a lower priority in order to resolve the conflict.

2.1 Search Modes

The ten consecutive search modes, which CPU 60 applies twice to specification database 68, are as follows:

1. Check each clock signal to itself (initial instantiation)
2. Check each clock signal to itself (further instantiation)
3. Check each clock signal to other clock signals (initial instantiation)
4. Check each clock signal to other clock signals (further instantiation)
5. Check each non-clock signal to itself (initial instantiation)
6. Check each non-clock signal to itself (further instantiation)
7. Check each non-clock signal to other non-clock signals (initial instantiation)
8. Check each clock signal to non-clock signals (initial instantiation)
9. Check each non-clock signal to other non-clock signals (further instantiation)
10. Check each clock signal to non-clock signals (further instantiation)

These tests cover all possible interactions between clock and non-clock signals, and represent the order and manner in which specifications are instantiated; without such a systematic strategy, comparative information among specifications could not be derived efficiently. The substance of the comparison and evaluation operations is embodied in the types of ambiguities that the invention is designed to detect as specifications are instantiated.

The series of search modes is executed twice due to the interrelationship among dependences; further instantiation possibilities will often arise as a consequence of performing subsequent search modes. Because of the central importance of clock signals, it is useful to restart the sequence of search modes every time a specification affecting a clock signal is affected. It has also been found that the fourth search mode can be omitted without significant impact on the accuracy of the extraction process.

The invention instantiates specifications according to certain preliminary assumptions about signal characteristics and initial states. All signals are presumed to begin in the asserted state, with the first state boundary indicating a change to the deasserted state. For data signals, the asserted state is presumed to be stable, and the deasserted state to be high-impedance; for clock and control signals, the logic levels associated with the asserted and deasserted states will have been derived from the pattern information or implied in the specifications themselves. For example, as described in the '269 application, signal names or descriptions typically indicate the identity of the asserted state. In the absence of such information, the invention simply presumes that an asserted signal corresponds to a high logic state.

Thus, the TBHAL specification described above permits the following entries to be added to the pattern files for signals A and B:

| Timestamps | Signal A | Signal B |
| --- | --- | --- |
| 0 | 0 | 0 |
| 0 | 1 | 1 |

| Timestamps | Signal A | Signal B |
|---|---|---|
| -continued | | |
| 10 | 0 | 1 |

In this example, timestamp values refer to absolute times. The first entry represents the zero transition for both signal patterns.

The specification is instantiated by construction of the following dependence file:

| Name | Type | Value | From | To | Priority |
|---|---|---|---|---|---|
| TBHAL | Min | 10 | B 1 | A 2 | Force |

2.2 Ambiguity Types

Inconsistency Among Specifications or Dependences: In some situations, timing constraints may initially appear incompatible; this may be detected at the specification level or at the dependence level. As an example of the former case, two specifications may call for a different pulse width for the same clock. In latter case, specifications involving different signals may produce a series of incompatible dependences.

Detection of these types of incompabilities can arise in any of several contexts: (i) during preliminary analysis of user-entered dependences, as described above; (ii) after application of the control procedure or procedures fails to produce a solution that permits instantiation of a specification; or (iii) when the compatibility test performed following pattern and dependence generation reveals a mismatch. In any of these instances, using techniques described in the '811 application, the user is provided with suggestions as to which, if any, dependence or dependences are eligible for priority reduction and time-interval alteration.

No Valid Period For Clock: During search modes 1 and 2, the invention attempts to elucidate periodic specifications for all clock signals. A complete set of specifications includes the elements depicted in FIG. 4, namely, rise time (TCR), fall time (TCF), active and inactive pulse widths (TCH and TCL), and cycle time (TCP). The invention searches through the specification database for these elements and, if TCP is not found, generates a suggested value from the existing expression values. If no expression values exist, the invention can suggest a TCP based on a default scheme or prompt the user for such values. The invention also determines whether the period suggested by the user's specifications is valid, i.e., greater than zero.

The invention accomplishes the foregoing by approaching minimum and maximum cycle times separately, and performing a prioritized list of operations on the existing specifications in an effort to fill in the missing pieces. Using letters as variables to denote expression values (with dashes indicating irrelevant parameters), a complete set of clock specifications is as follows:

| Symbol | Description | Min | Max | Typ |
|---|---|---|---|---|
| TCF | Clock Fall Time | e | f | — |
| TCH | Pulse Width, Active | c | d | — |
| TCL | Pulse Width, Inactive | g | h | — |
| TCP | Clock Cycle Time | temp__min | temp__max | — |
| TCR | Clock Rise Time | a | b | — |

The invention divides minimum and maximum cycle time (temp__min and temp__max) into two components (see FIGS. 5–8) and establishes each of the necessary values separately; the two components are added together to obtain values for temp__min and temp__max, which represent final minimum and maximum values of TCP.

Figure 5:
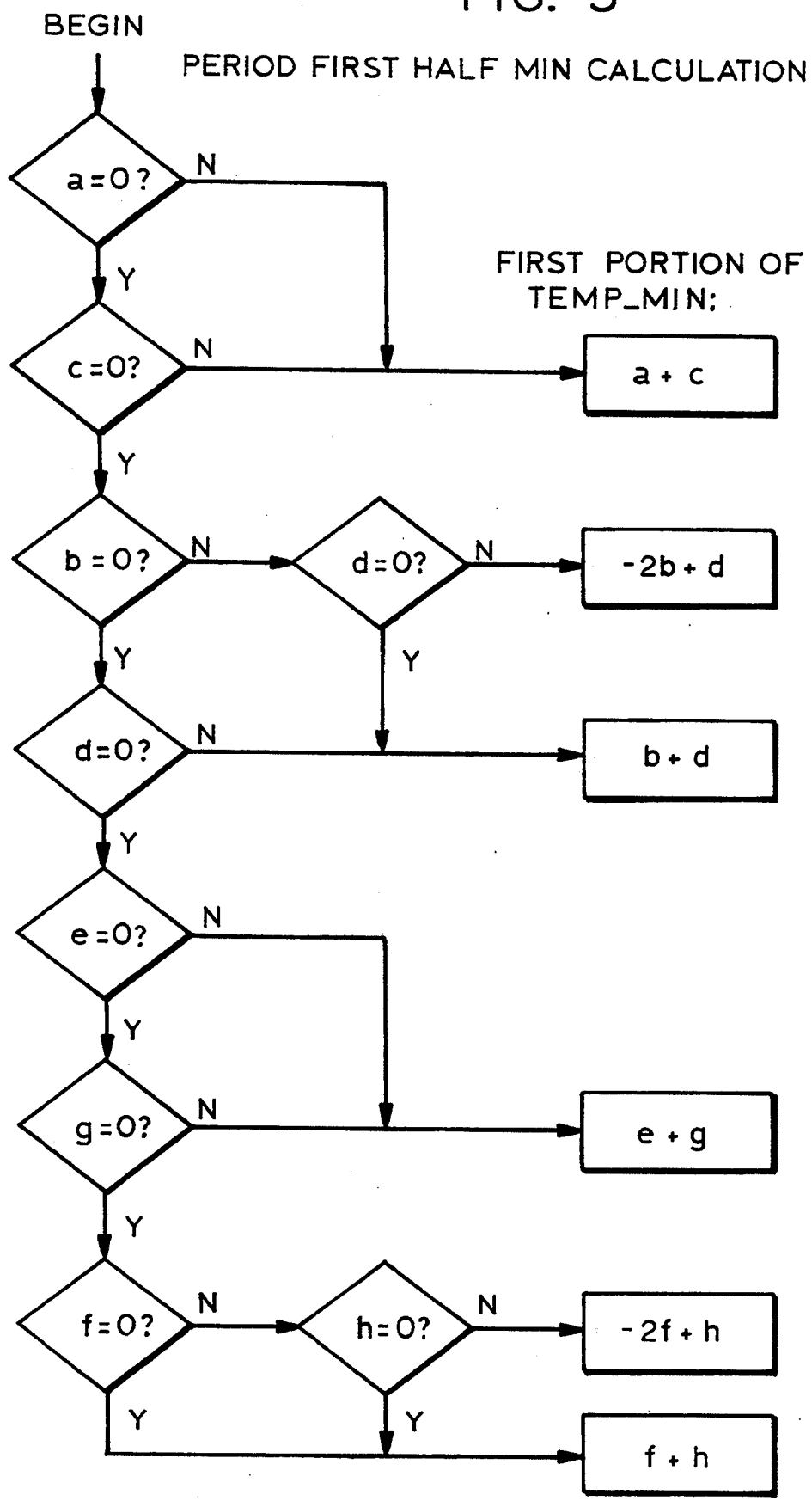
FIG. 5 is a flow chart that describes calculation of the first component of a minimum clock period.

The first component of temp__min includes minimum values for TCR and TCH, and is derived according to the procedure outlined in FIG. 5. Specifically, if a search of the specification database reveals non-zero values for both a and c, the invention concludes that the first component of temp__min equals a+c. However, without non-zero values for both of these variables, the invention resorts to use of maximum time values (e.g., −2b+d). If no TCR or TCH values are available, the invention assumes equivalence between active and inactive pulse widths, as well as between rise and fall times; again, initial preference is given to minimum times, but in the absence thereof the invention will employ the less directly relevant maximum times and assume equivalence.

Figure 6:
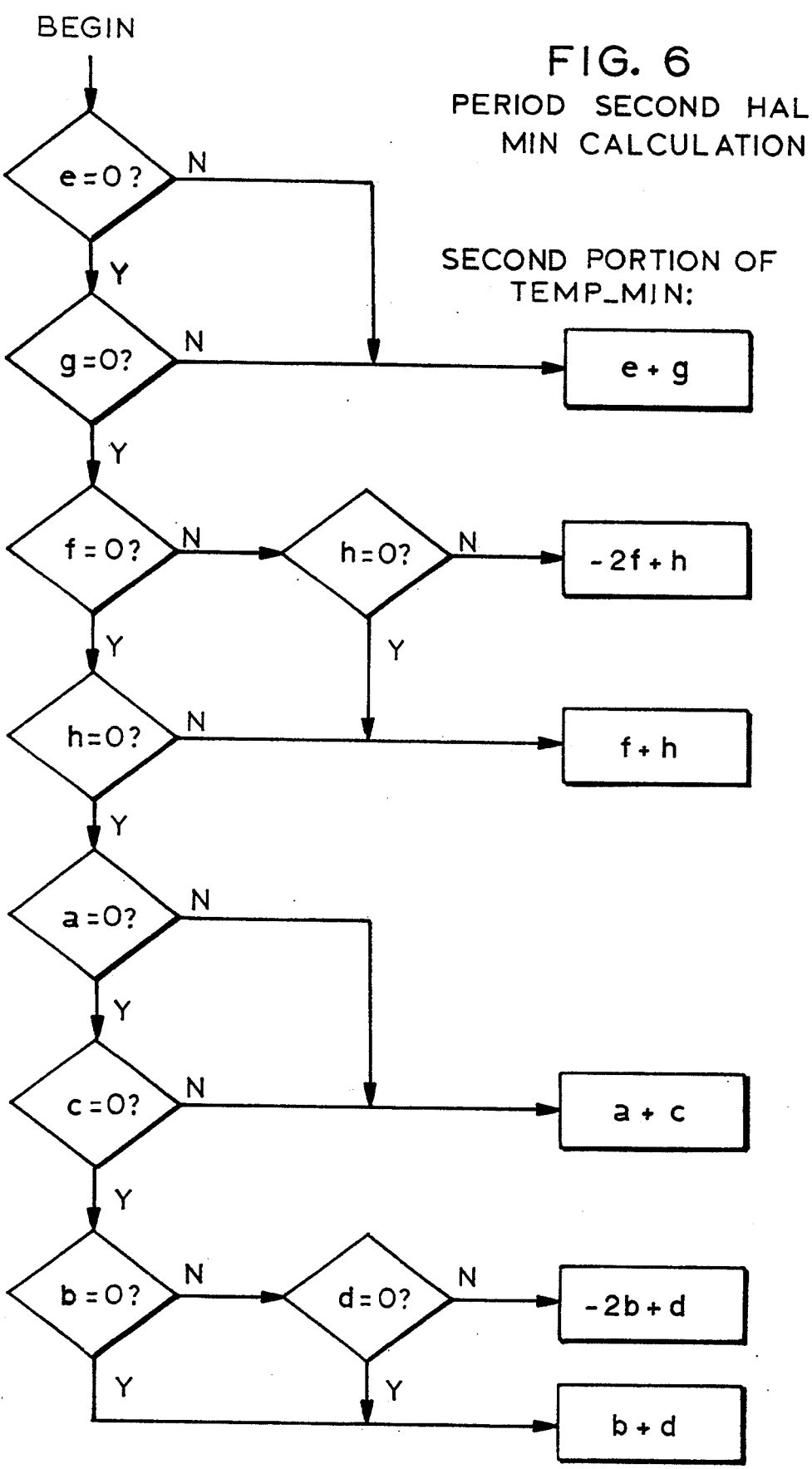
FIG. 6 is a flow chart that describes calculation of the second component of a minimum clock period.
Figure 7:
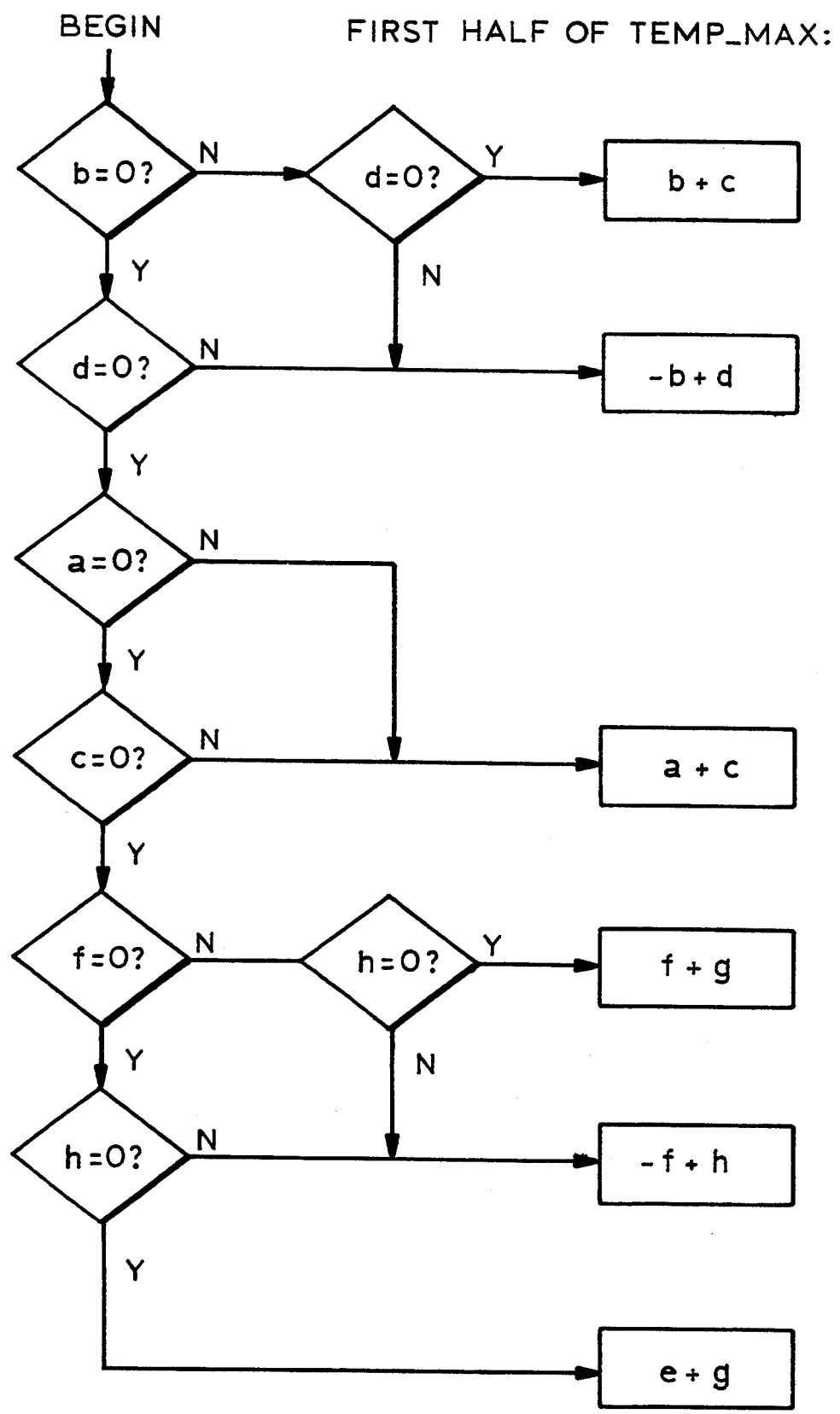
FIG. 7 is a flow chart that describes calculation of the first component of a maximum clock period.
Figure 8:
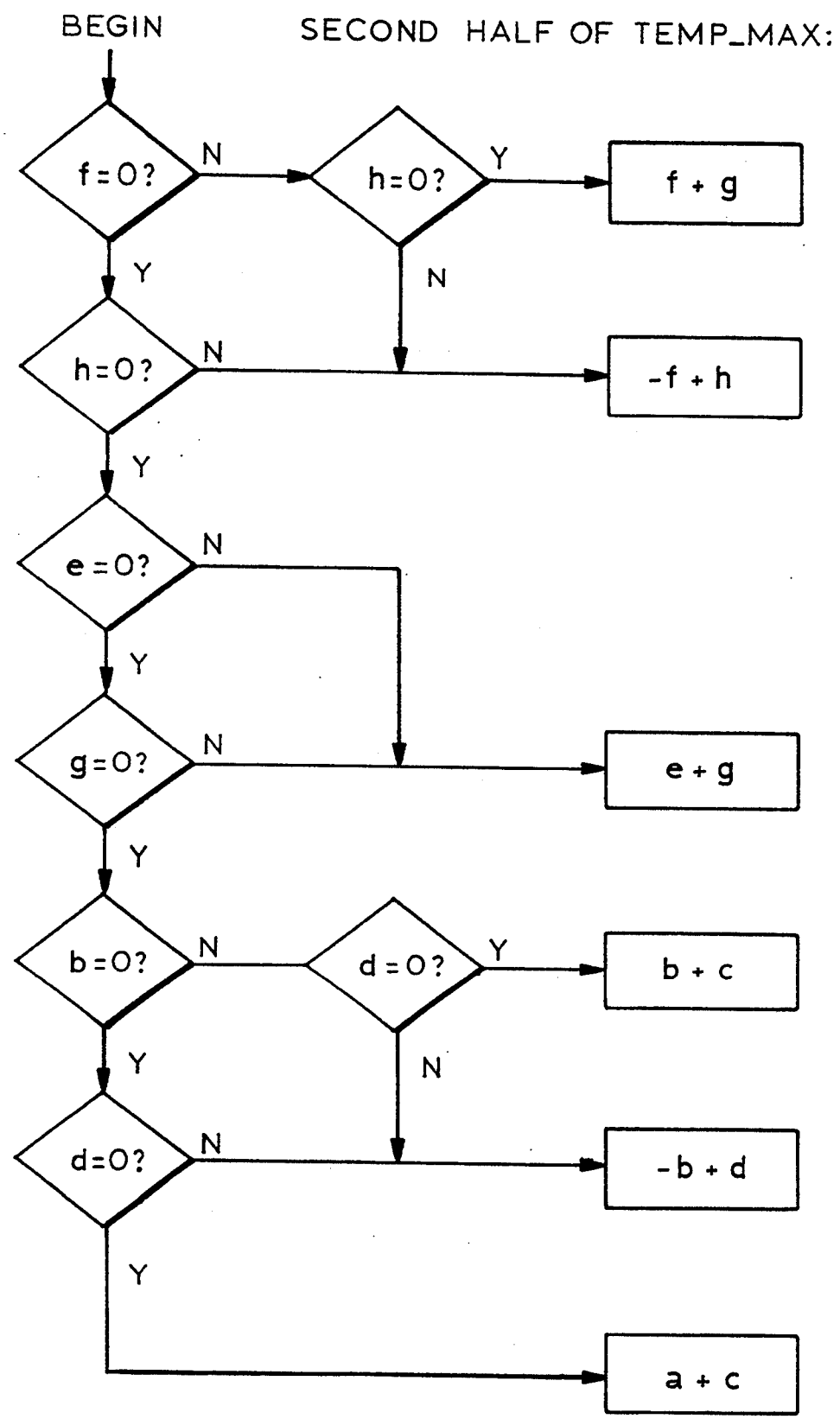
FIG. 8 is a flow chart that describes calculation of the second component of a maximum clock period.

A similar procedure, using similar priorities, is performed to generate the second component of temp__min; this is shown in FIG. 6. To obtain temp__max and values for the associated maximum components, the foregoing strategy is reversed. This is depicted in FIG. 7 (which relates to the first component that includes TCR and TCH), and FIG. 8 (which relates to the second component that includes TCF and TCL). For temp__max values, priority is given to generating values based on the maximum variables; if these are not available, the invention assumes equivalence between minimum and maximum values.

After generating the final TCP values, CPU 60 creates a specification in specification database 68 having the appropriate symbol and values.

No Non-Zero Pulse Width On Clock: In some cases, analysis of the user's specifications reveals that one or more clock signals lack a valid pulse width. The invention will then attempt to generate a pulse width for the active portion of the clock period.

Reordering the variables of the clock specification presented above for clarity and designating the minimum and maximum intervals of the active pulse width as temp__min and temp__max, respectively,

| Symbol | Description | Min | Max | Typ |
|---|---|---|---|---|
| TCF | Clock Fall Time | e | f | — |
| TCH | Pulse Width, Active | temp__min | temp__max | — |
| TCL | Pulse Width, Inactive | — | — | — |
| TCP | Clock Cycle Time | c | d | — |
| TCR | Clock Rise Time | a | b | — |

Figure 9:
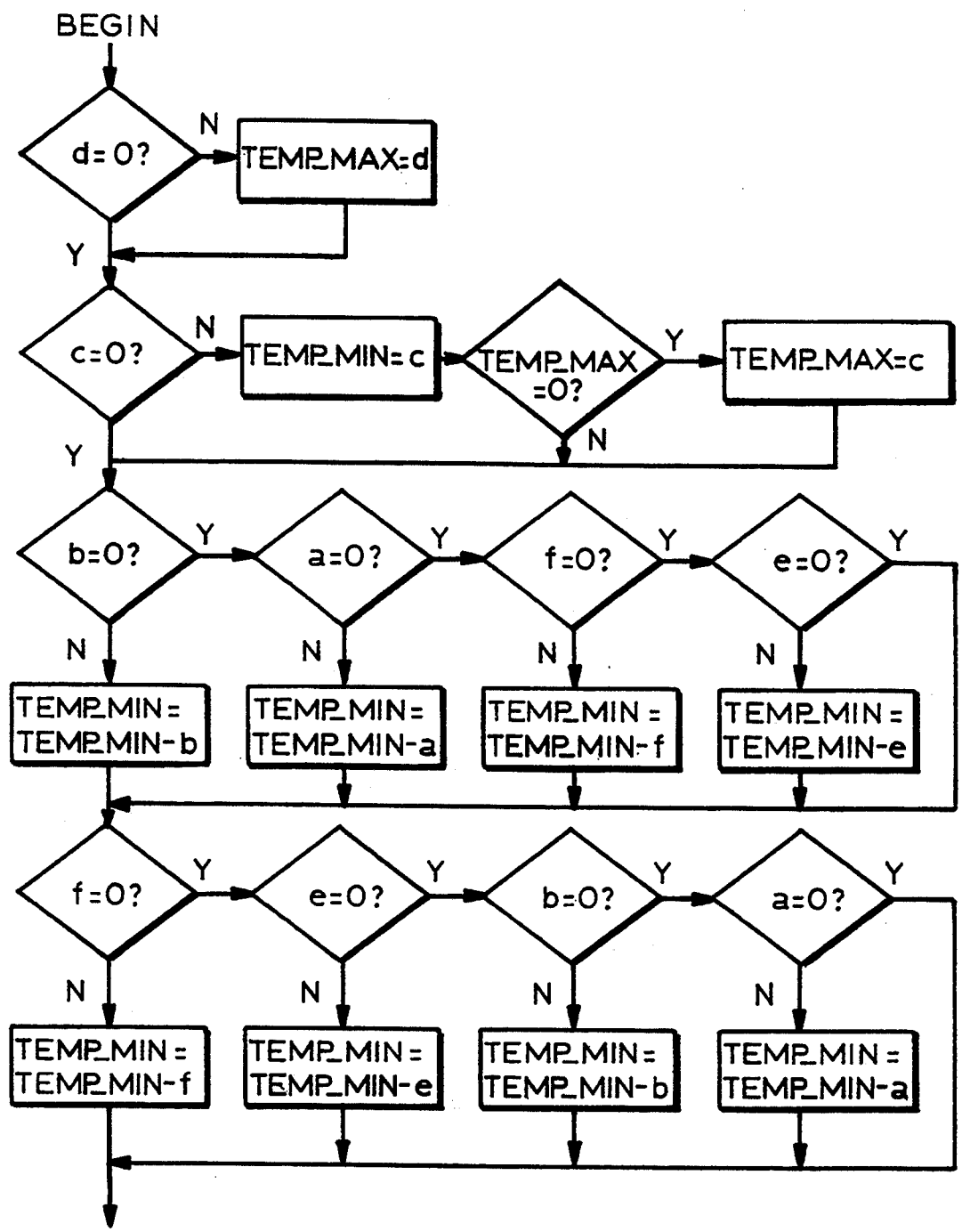
FIG. 9 is a flow chart that describes calculation of a signal pulse width.

The strategy for obtaining minimum and maximum values of TCH is set forth in FIG. 9. The maximum value for TCH, temp__max, is preferably derived from the cycle time; ideally, temp__max is set equal to the maximum cycle time d, but the minimum time c is used if d is unspecified. Preferably, both values will either have been provided by the user or derived in the procedure discussed above. Essentially, temp__min is initially set equal to the minimum cycle time; the rise and fall times on each side of the cycle are then successively subtracted to isolate the pulse width itself. Ideally, the maximum rise and fall times b and f are utilized, but zero values for these variables results in substitution of the minimum values. If both minimum and maximum values for either rise or fall times are unspecified, the invention assumes equivalence therebetween.

CPU 60 performs a check on both input and derived values to verify their consistency with basic signal characteristics. Specifically, CPU 60 ascertains that minimum and maximum values are positive, and the maximum values exceed minimum values.

After generating the final TCH values, CPU 60 creates a specification in specification database 68 having the appropriate symbol and values.

Specification Not Instantiated or Capable of Further Instantiation: In these cases, examination of pattern files 72 reveals the existence of at least one site that would permit instantiation of a specification, or examination of dependence files 70 reveals a specification associated with a particular signal that has not been instantiated on that signal.

In the former case, the eligible site furnishes the basis for construction of a new dependence file. In the latter case, the invention attempts to extend or alter the existing pattern information to create a suitable site by invoking a control procedure.

Site eligibility depends on fulfillment of two criteria: (i) the pattern file must conform to the restrictions of the specification; and (ii) instantiation does not result in the new dependence "crossing" another dependence. With regard to the pattern file, certain pattern restrictions apply to different types of signals (e.g., pulse widths) and intervals (e.g., hold, setup times). Such restrictions are described, for example, in JEDEC Standard No. 100 (Electronic Industries Association, 1982) ("JEDEC"). As an illustration, a pulse width is defined in JEDEC as the time interval between specified reference points on the two transitions of the pulse waveform. Accordingly, where a pulse width is specified, the pattern file must be able to accommodate the designated interval between two transitions. These restrictions are also expressed in Table 1.

The specification may also contain further restrictions beyond those inherent in its classification. Thus, the specification "Valid time, A to B, 30 ns max" imposes fewer restrictions than the specification "Valid time, A high to B low, 30 ns max". In the latter case, pattern file entries must conform to specific states as well as characteristics associated with valid time specifications generally.

In general, otherwise acceptable sites for dependence instantiation are considered ineligible if they are "crossed" by another dependence. Typically, crossing occurs when an existing dependence and a proposed dependence between the same two signals intersect at a common state boundary, or when the specification for which a site is proposed has the same name as an existing dependence to that site. The presence of the latter condition indicates that the same dependence is specified in more than one way, so the redundant specification can be ignored.

Figure 10:
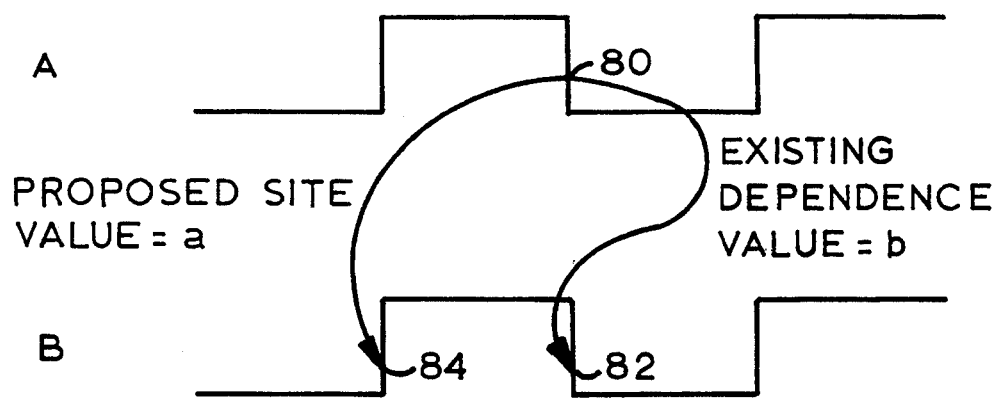
FIGS. 10 to 23 illustrate instances of dependence crossing.
Figure 11:
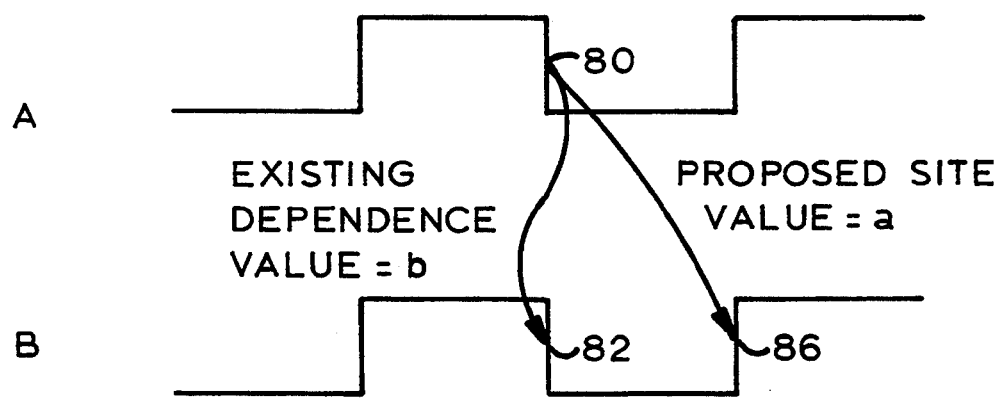

FIGS. 10 through 23 more specifically illustrate instances of crossing. In FIG. 10, impermissible crossing occurs when an existing dependence from a source state boundary 80 to a destination state boundary 82 has an interval value b less than the interval value a of a proposed state boundary between the same source state boundary 80 and a proposed destination state boundary 84 that occurs earlier in time than that of the existing dependence. An analogous situation is shown in FIG. 11, where the destination state boundary 86 of the proposed dependence occurs later in time than that of the existing dependence from source state boundary 80 to destination state boundary 82. In this case, however, crossing is deemed to occur where the interval a of the proposed dependence is less than the interval b of the existing dependence.

Figure 12:
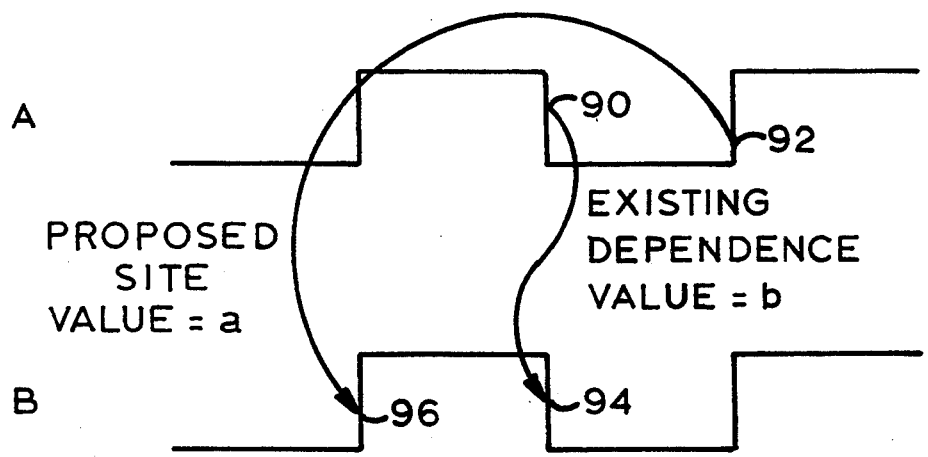
Figure 13:
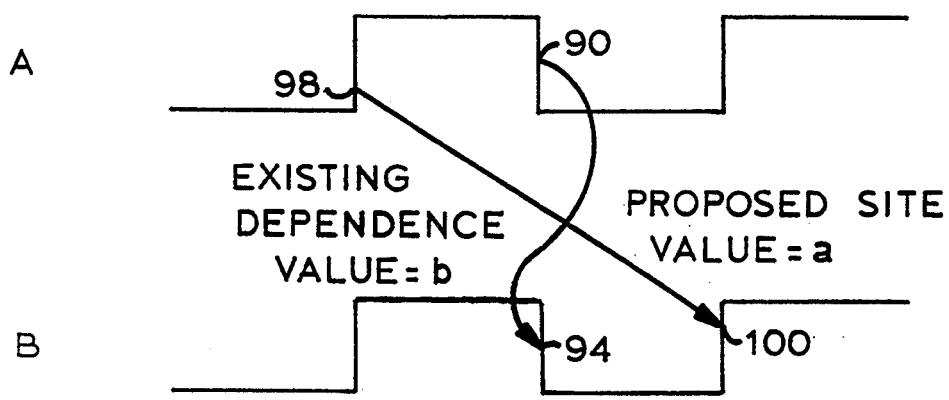

A second type of configuration where crossing can occur is depicted in FIGS. 12 and 13, where dependences originate on two consecutive source state boundaries and terminate on consecutive destination state boundaries. In FIG. 12, the proposed dependence originates on a source state boundary 92 that occurs after the source state boundary 90 of the existing dependence, and terminates on a proposed destination state boundary 96 that occurs prior in time to the destination state boundary 94 of the existing dependence. Under these circumstances, crossing occurs if the interval a of the proposed dependence exceeds the interval b of the existing dependence. In the related situation depicted in FIG. 13, where the source state boundary 98 of the proposed dependence occurs prior to the source state 90 of the existing dependence and the destination state boundary 100 of the proposed state boundary occurs after the destination state boundary 94 of the existing dependence, crossing occurs when the interval a of the proposed dependence is less than the interval b of the existing dependence.

Figure 14:
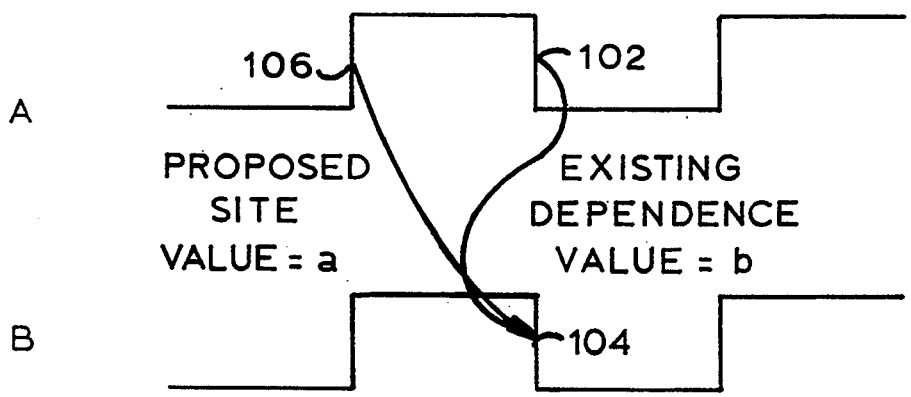
Figure 15:
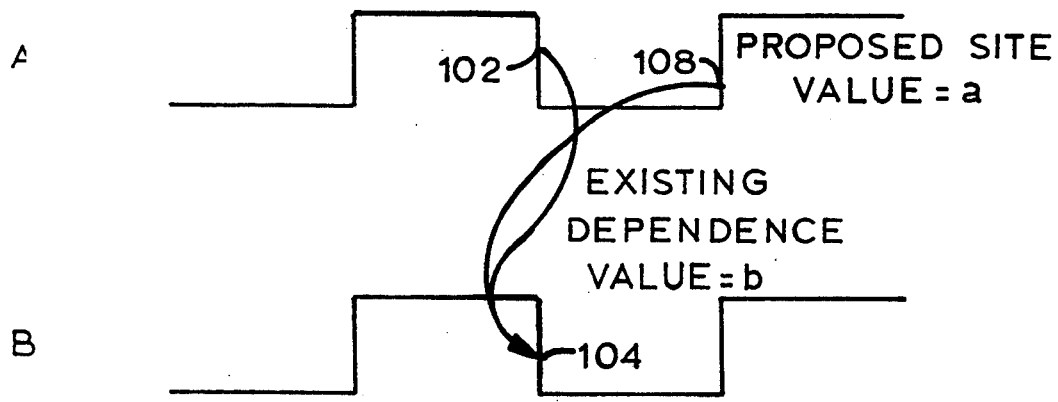
Figure 16:
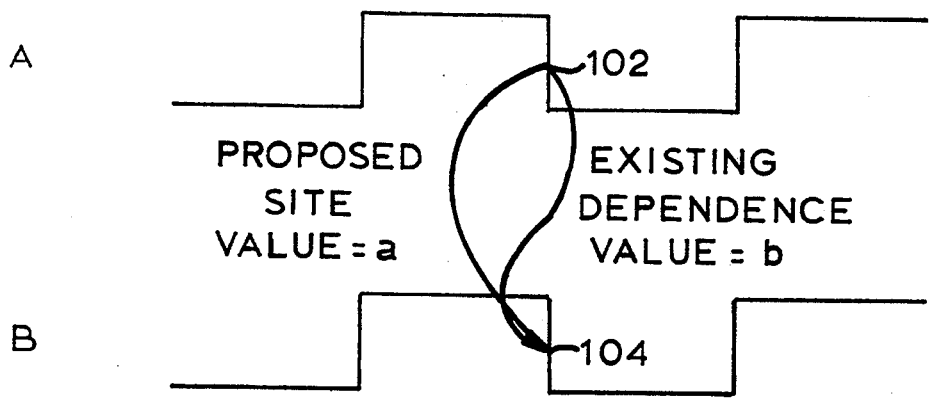
Figure 17:
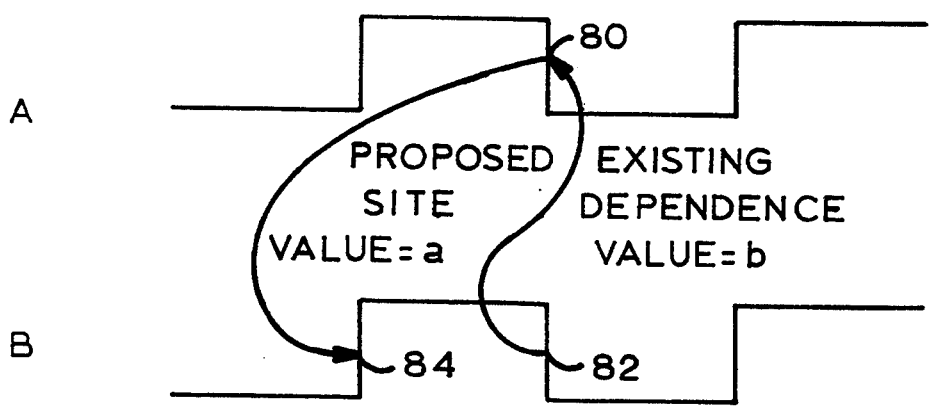

FIGS. 14–16 illustrate situations where the destination state boundaries 104 of proposed and existing dependences are identical. In FIG. 14, the source state boundary 106 of the proposed dependence occurs before that of the existing dependence; crossing occurs where the interval a of the proposed dependence is less than the interval b of the existing dependence. If the source state boundary of the proposed dependence occurs later than that of the existing dependence (see source boundary 108 in FIG. 15), crossing occurs if the interval a of the proposed dependence exceeds the interval b of the existing dependence.

In cases in which both the existing and proposed state boundaries originate and terminate on the same state boundaries (see FIG. 16), one inverts the rule that crossing occurs when the proposed dependence has the same name as an existing dependence to that site: in these situations, crossing occurs if the existing dependence does not have the same name as the proposed dependence, or if the type (minimum or maximum) does not match.

FIGS. 17 through 23 illustrate variations on the foregoing configurations. In the preceding discussion, all dependences originated on the same signals. In FIGS. 17–23, by contrast, dependences that affect the same two signals do not originate on the same signal, and the test to determine crossing differs from those illustrated in FIGS. 10–16 in that the interval of the proposed dependence is compared with additive inverse of the existing dependence. Thus, in FIG. 17, state boundary 80 now represents the destination state boundary of the existing dependence but the source state boundary of the proposed dependence. Crossing occurs if the interval a of the proposed dependence is greater than the additive inverse of the interval b of the existing dependence.

Figure 18:
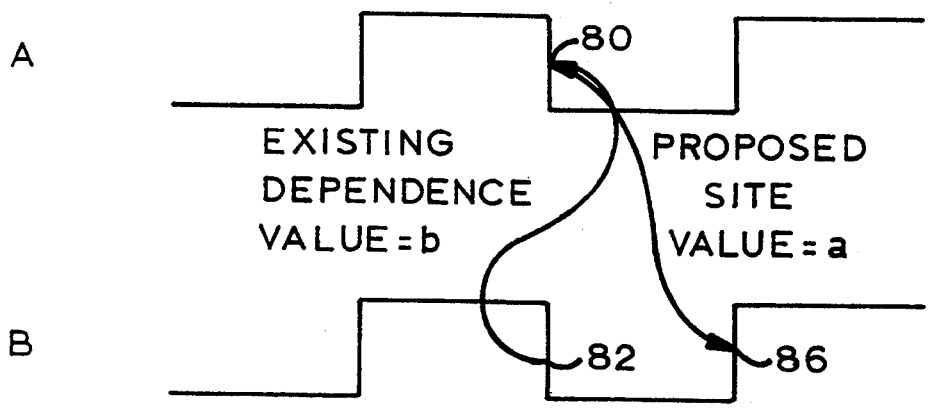
Figure 19:
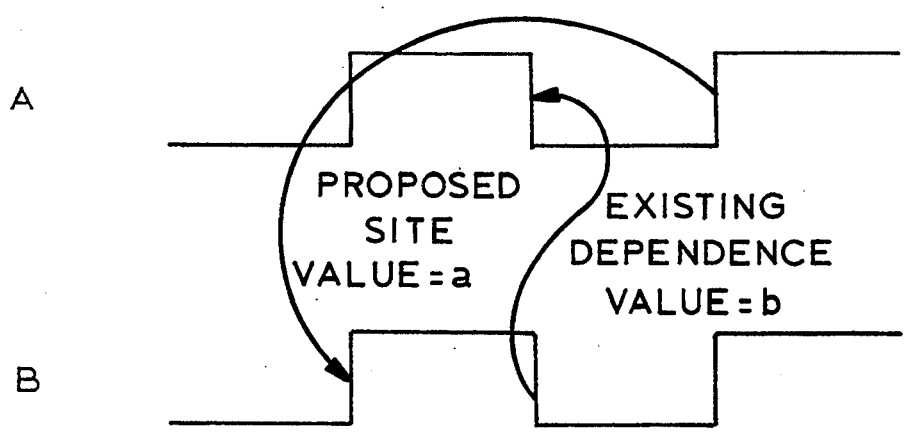
Figure 20:
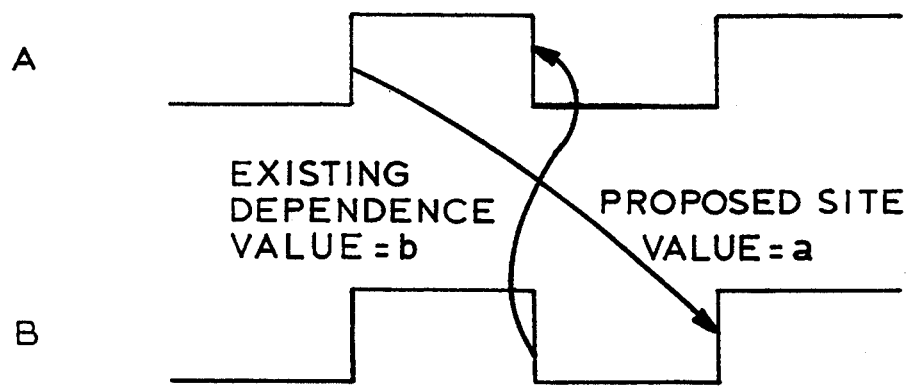
Figure 21:
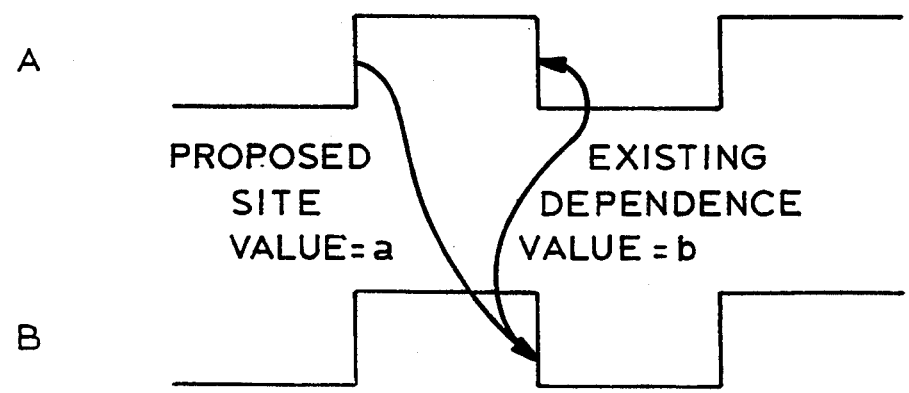
Figure 22:
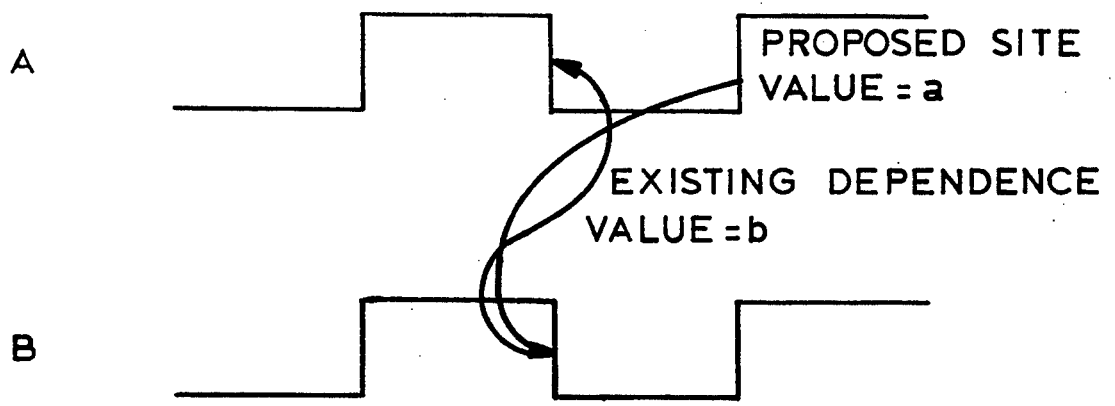
Figure 23:
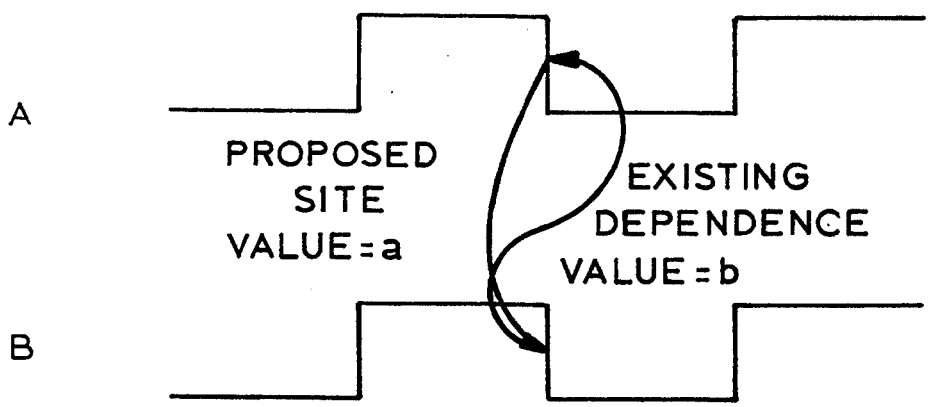

Crossing occurs in FIG. 18 if the interval a of the proposed dependence is less than the additive inverse of the interval b of the existing dependence; in FIG. 19 if the interval a of the proposed dependence is greater than the additive inverse of the interval b of the existing dependence; in FIG. 20 if the interval a of the proposed dependence is less than the additive inverse of the interval b of the existing dependence; in FIG. 21 if the interval a of the proposed dependence is less than the additive inverse of the interval b of the existing dependence; and in FIG. 22 if the interval a of the proposed dependence is greater than the additive inverse of the interval b of the existing dependence. In FIG. 23, the criteria are the same as those discussed in connection with FIG. 16.

2.3 Control Procedures

The first operation performed on a pattern file in order to provide a site for specification instantiation is cycle addition. In effect, the signal—as expressed in the associated pattern file—is augmented by appending at least two states, corresponding to a cycle, in the pattern file. Cycles are appended based on the last state of the signal in the pattern file, according to a rule governing the particular type of signal involved. Specifically, the first appended state is the logical inverse of the previous state, and the logic state of the second appended state is the inverse of that of the first. For clock and control signals, the inversions simply represent opposite low or high logic states; for data signals, stable signals are presumed to invert to a high-impedance condition, and vice versa.

After the cycle is appended to the pattern file, the invention attempts to instantiate the unconnected specification at one of the newly created sites according to the eligibility criteria discussed above. If this is successful, the pattern information is retained, and a new dependence file is created.

If the cycle addition procedure fails to yield a suitable site, the invention will perform a state-alteration procedure on the last (appended) state of the signal; that is, the logic condition of the most recently appended state will be altered according to rules specific to the type of signal involved. Unless more specific state information is provided in the specification, control and clock signals are altered by changing the last state to high impedance; data signals are altered by changing the last state to stable or by inserting a stable state just before the last state if the last state is already stable.

2.4 Verification

Preferably, CPU 60 performs a procedure to verify the validity of the dependences generated during extraction. This involves creation of a separate specification database from the dependences (both newly generated and user-provided), and comparison of the new specification database with the original. This facilitates determination whether the specifications implied by the entire set of dependences exist in the original set of specifications, or at least whether the implied specifications are compatible with those actually entered by the user.

3. Transition-State Insertion and Arbitration

The extraction process produces pattern files containing a set of non-transition states having defined intervals, and a set of dependence files relating to the pattern files. In reality, however, transitions between states occur over finite times, and it is therefore necessary to place transition states between the non-transition states. Furthermore, the control procedures may have introduced more transitions than were actually necessary to satisfy all of the specifications.

The invention first identifies where transition states should be added, i.e. which transitions among non-transition states are actually necessary. CPU 60 places transition states in pattern files 72 where the state boundary between two non-transition states is connected (in a dependence file) to at least one state boundary that could occur much earlier and at least one state boundary that could occur much later. In addition, if a state boundary is connected to a single dependence that loops back to the same state boundary (such as might be the case for a rise or fall time), CPU 60 will insert a transition state.

Figure 24:
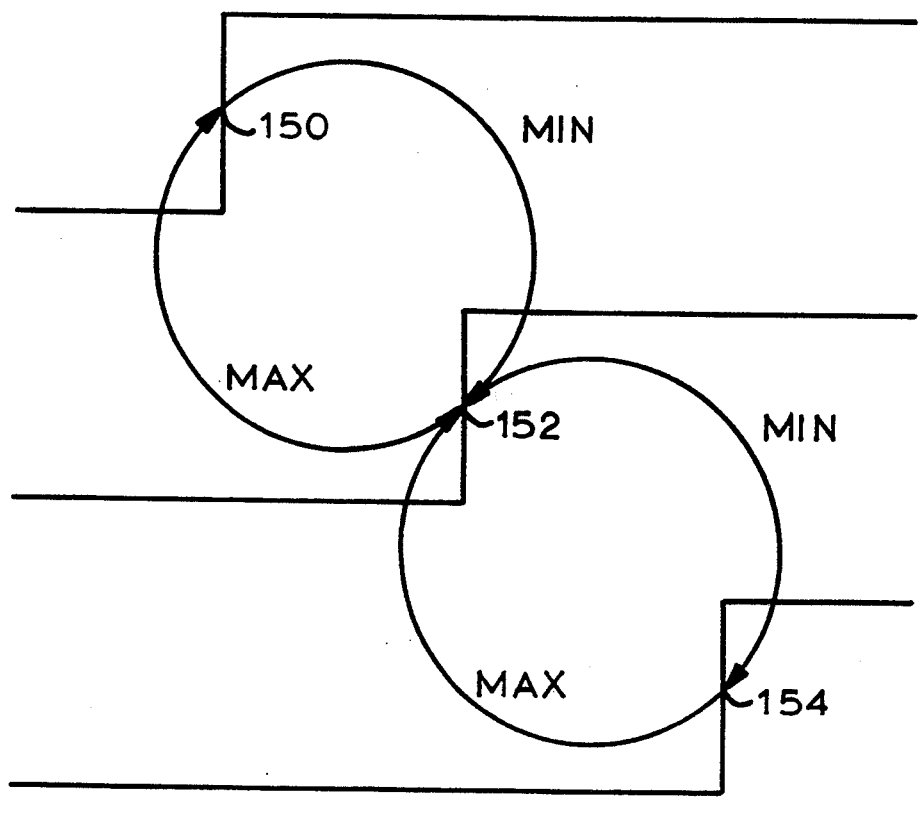
FIG. 24 depicts the condition for insertion of a transition state into a pattern file after extraction.

A transition is considered to occur much earlier in time if the dependence attached to it is a minimum, or if the dependence attached from it is a maximum. Conversely, a transition is considered to occur much later in time if the dependence attached to it is a maximum, or if the dependence attached from it is a minimum. This condition is illustrated in FIG. 24. A first state boundary 150 occurs before a second state boundary 152 if the dependence from state boundary 150 to state boundary 152 is a minimum, or if the dependence from state boundary 152 to state boundary 150 is a maximum. Similarly, a third state boundary 154 occurs later than state boundary 152 if the dependence from state boundary 152 to state boundary 154 is a minimum, or if the dependence from state boundary 154 to state boundary 152 is a maximum. In order for the invention to insert a transition at state boundary 152, dependences to at least one earlier and later transitions must exist.

There are three exceptions to the above rule. As noted above, a transition state will be inserted in the case where two dependences that originate and terminate on the same state boundary; however, this transition will not be eligible for stepping, which is discussed below.

The second exception involves dependences with "solve" priority levels; the invention does not insert transitions to accommodate such dependences.

Figure 25:
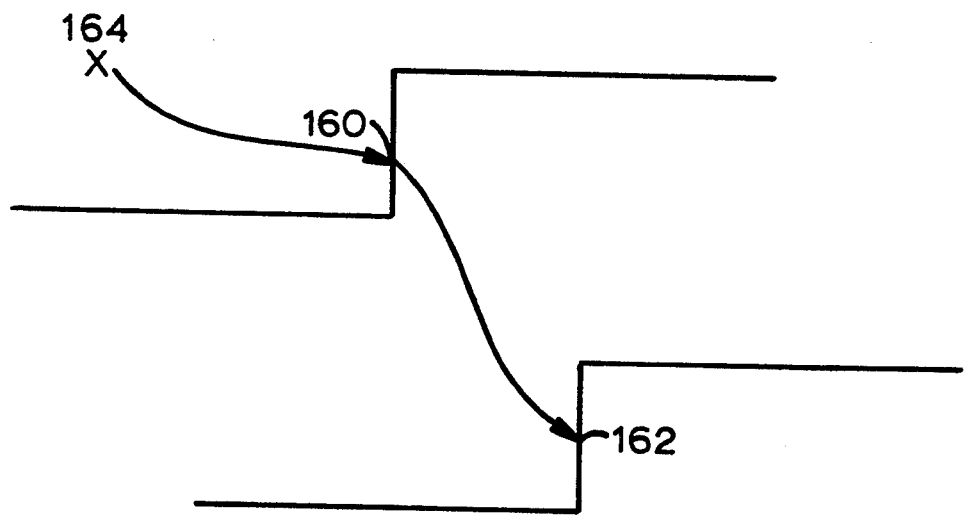
FIG. 25 shows the manner in which the invention inserts a transition at a state boundary where a dependence connects the state boundary with a later state boundary and another dependence connects it to zero time.

The third exception is illustrated in FIG. 25. A transition will be inserted at a state boundary 160 where a dependence connects this state boundary with a later state boundary 162 and another dependence connects it to zero time (i.e., to a state boundary 164 that represents a zero transition). This exception preserves initialization dependences that bring the initial state to a start time.

Because transition states occupy a discrete period of time, it becomes necessary to choose not only the signal location but also the temporal position at which it should be inserted—that is, how the dependences should be attached to it. FIG. 26 illustrates three standard possibilities. In the figure, a signal changes state from a low logic level 180 to a high logic level 182. Before transition state insertion, the states are connected to one another by a state boundary 184, which has no duration. The transition state, which occurs over an interval and is therefore represented by a line having positive slope, may be placed in any of the three positions indicated by reference numerals 186, 188 and 190; the optimal position depends on device performance characteristics. However, experience with typical signal interactions suggests a method of provisionally determining the part of the transition state to which a dependence should relate.

The invention first replaces the state boundaries with transition states, each having two transitions, and for simplicity first assumes that each dependence is connected at the beginning (first) transitions of two of the newly introduced transition states; it ultimately assigns each connection of the dependence to the beginning or ending (i.e. first or second) transition of these transition states based on a series of rules illustrated pictorially in FIGS. 27-30 and summarized in Table 2; these are described below. With appropriate modification, the invention could be configured to accommodate connections to intermediate points along a transition state. In other words, the rules articulated below dictate whether each transition of a dependence will remain the first transition of the transition state that replaced the relevant state boundary (as is initially assumed) or will be shifted to the second transition of this transition state.

TABLE 2

| Value | Type | Clock1 | Clock2 | Signal1 == Signal2 | Step1 | Step2 |
|---|---|---|---|---|---|---|
| + | min | 0 | 0 | 0 | 0 | 0 |
| + | min | 0 | 0 | 1 | 1 | 0 |
| + | min | 0 | 1 | 0 | 1 | 0 |
| + | min | 0 | 1 | 1 | 1 | 0 |
| + | min | 1 | 0 | 0 | 1 | 0 |
| + | min | 1 | 0 | 1 | 1 | 0 |
| + | min | 1 | 1 | 0 | 1 | 0 |
| + | min | 1 | 1 | 1 | 1 | 0 |
| + | max | 0 | 0 | 0 | 1 | 1 |
| + | max | 0 | 0 | 1 | 0 | 1 |
| + | max | 0 | 1 | 0 | 0 | 1 |
| + | max | 0 | 1 | 1 | 0 | 1 |
| + | max | 1 | 0 | 0 | 0 | 1 |
| + | max | 1 | 0 | 1 | 0 | 1 |
| + | max | 1 | 1 | 0 | 0 | 1 |
| + | max | 1 | 1 | 1 | 0 | 1 |
| − | min | 0 | 0 | 0 | 1 | 1 |
| − | min | 0 | 0 | 1 | 1 | 0 |
| − | min | 0 | 1 | 0 | 1 | 0 |
| − | min | 0 | 1 | 1 | 1 | 0 |
| − | min | 1 | 0 | 0 | 1 | 0 |
| − | min | 1 | 0 | 1 | 1 | 0 |
| − | min | 1 | 1 | 0 | 1 | 0 |
| − | min | 1 | 1 | 1 | 1 | 0 |
| − | max | 0 | 0 | 0 | 0 | 0 |
| − | max | 0 | 0 | 1 | 0 | 1 |
| − | max | 0 | 1 | 0 | 0 | 1 |
| − | max | 0 | 1 | 1 | 0 | 1 |
| − | max | 1 | 0 | 0 | 0 | 1 |
| − | max | 1 | 0 | 1 | 0 | 1 |
| − | max | 1 | 1 | 0 | 0 | 1 |
| − | max | 1 | 1 | 1 | 0 | 1 |

In Table 2, dependences having specified characteristics are defined on the left of the table. The Value of a dependence incorporates its polarity, and its Type indicates whether the dependence denotes a minimum or maximum time. Each of the two signals to which a dependence relates can be a clock or non-clock signal; the signal type has significance for operation of the rules, and the status of each signal as clock or non-clock is indicated by the entry in the Clock1 and Clock2 columns. Specifically, a Clock1 value of 1 indicates that the first signal of the dependence is a clock; an entry of 0 means that the signal is control or data. Similarly, the value of the Clock2 entry indicates whether the second signal of the dependence is a clock. A value of 1 under the column titled "Signal1==Signal2" indicates that the dependence is connected to transitions within a single signal; a value of 0 means that the dependence relates two distinct signals.

Based on these characteristics, entries under the columns titled "Step1" and "Step2" indicate whether the first and second signals, respectively, of a dependence are to be shifted from the first to the second transitions of the relevant transition state. A value of 1 means that the dependence will be shifted to the second transition, while a value of 0 indicates that it will remain connected to the first transition.

Figure 27:
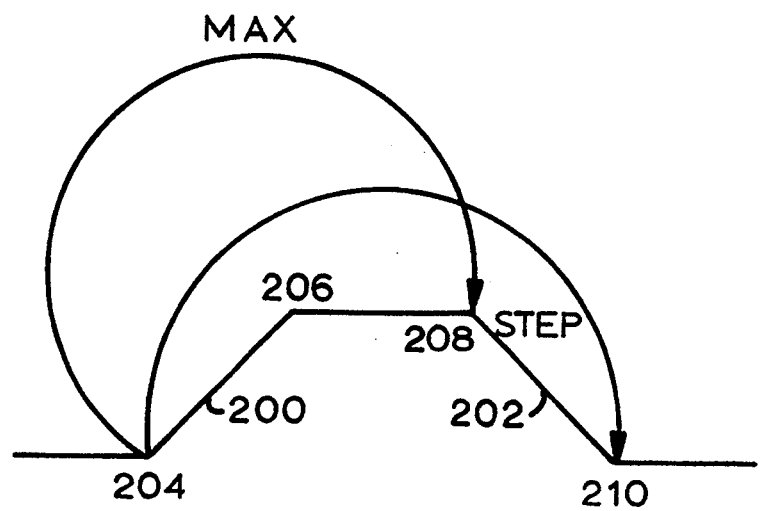
Figure 28:
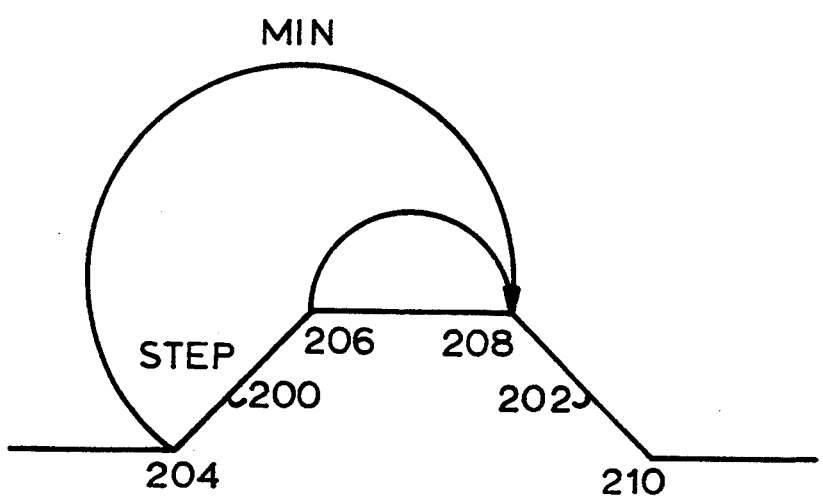

The rules embodied in Table 2 are illustrated in FIGS. 27-30. FIGS. 27 and 28 depict rules for dependences relating to transitions on the same signal. As shown in both figures, two transition states 200, 202 have been inserted in place of state boundary precursors. As stated above, dependences are initially connected to the first transition of each newly introduced transition state. Accordingly, a dependence (e.g., a pulse width) between what were formerly state boundaries will initially be connected to first transitions 204, 208. CPU 60 recognizes this configuration as erroneous, and causes the dependence to "step" from first transition 208 to second transition 210 (as shown in FIG. 27) or from first transition 204 to second transition 206 (as shown in FIG. 28). As shown in the two figures, the choice between these approaches depends on whether the dependence is a minimum or a maximum.

Figure 29:
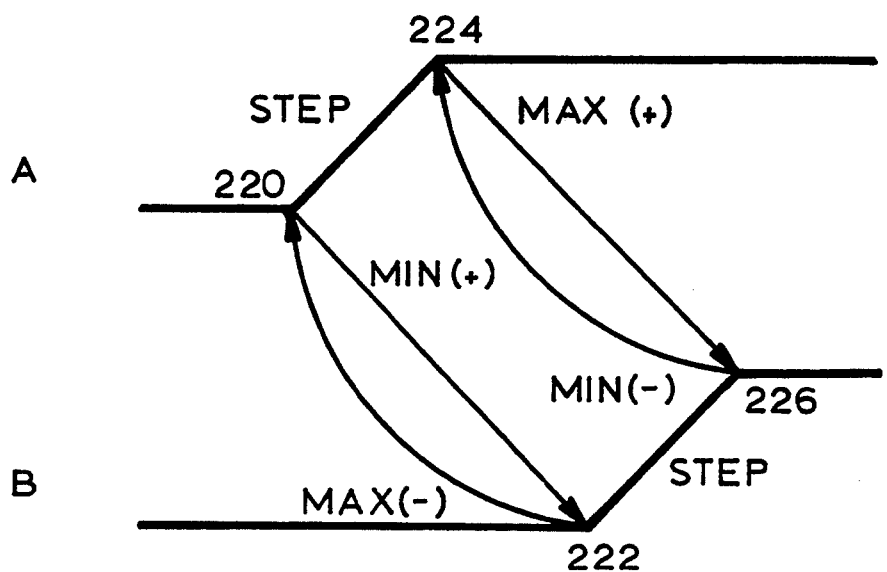

FIG. 29 illustrates the rules for dependences between different, non-clock signals (such as might be associated with a buffer). The dependence is initially connected between first transitions 220, 222. If the dependence has a positive polarity and is a minimum, or if it has a negative polarity and is a maximum, neither transition will be stepped. However, if the dependence has a positive polarity and is a maximum, or if it has a negative polarity and is a minimum, both transitions will be stepped so that the dependence connects second transitions 224, 226.

Figure 30:
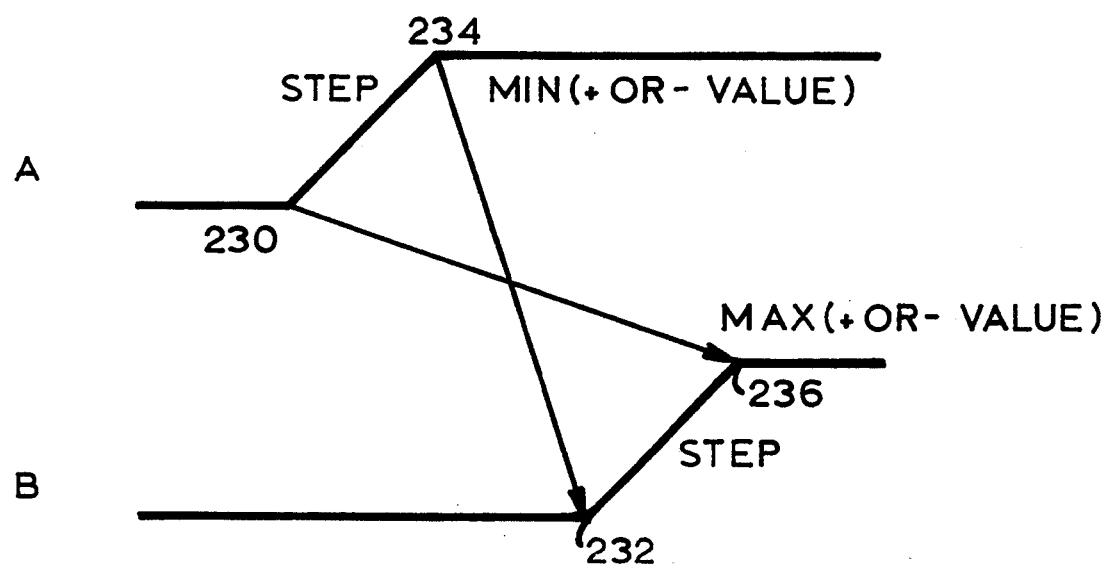

FIG. 30 depicts the stepping rules for dependences between different signals, at least one of which is a clock. Initially, the dependence relates first transitions 230, 232. If the dependence is a minimum (regardless of its polarity), the source transition is stepped from first transition 230 to second transition 234. If the dependence is a maximum (regardless of its polarity), the destination transition is stepped from first transition 232 to second transition 236.

After all transitions have been inserted and dependences connected to appropriate positions of the transition states, CPU 60 adds timestamps to pattern files 72. Because the final set of dependences contains no non-zero cycles—that is, the set is self-consistent—zero transitions may be used to initialize zero time, and the established intervals of transition and non-transition states employed to place timestamp values at transition points in the pattern files.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method for generating signal pattern and dependence information from a plurality of timing specifications, each specification including a classification, a reference to at least one source signal and at least one destination signal, a time interval having magnitude and direction and a comparison expression, the method comprising the steps of:

a. analyzing the specifications the determine whether:
   i. any timing inconsistencies exist among the specifications, and if so, recording the identity of each specification with respect to which an inconsistency exists;

ii. if the specifications designate any clock signals, a valid period for each such clock signal is set forth, and if not, generating at least one additional specification to set forth such a valid period;

iii. if the specifications designate any clock signals, a valid pulse width for each such clock signal is set forth, and if not, generating at least one additional specification to set forth such a valid pulse width;

b. generating dependences from the specifications, each dependence including a type designation, a permissible timing interval, designation of at least one location on at least one signal, and a priority attribute;

c. resolving inconsistencies among dependences generated from specifications identified as inconsistent by lowering the priority attribute of at least one dependence;

d. generating at least one preliminary signal pattern that specifies a sequence of non-transition states separated by state boundaries, and which are consistent with the dependences, the state boundaries corresponding to signal locations of the dependences;

e. replacing at least some of the state boundaries with transition states, each transition state including a permissible time interval and two transitions, to produce at least one final signal pattern; and f. replacing each dependence signal location with a designation of a transition.

2. The method of claim 1 wherein the state boundaries of the preliminary signal patterns are designated based on criteria comprising:

a. consistency with both the specifications and the dependences; and b. absence of dependence crossing among state boundaries.

3. The method of claim 2 wherein the preliminary signal patterns are augmented by cycle addition so as to be consistent with the dependences.

4. The method of claim 3 wherein, if cycle addition does not result in consistency with the dependences, the last state of the added cycle is altered.

5. The method of claim 1 wherein a state boundary is replaced with a transition state if at least one of the following conditions is fulfilled:

a. the state boundary is designated in at least one dependence that also designates a second state boundary that occurs earlier in time, and is also designated in at least one other dependence that also designates a third state boundary that occurs later in time;

b. a dependence designates no signal location other than state boundary; and c. the state boundary is designated in at least one dependence that also designates a second state boundary that occurs later in time, and also designates a zero transition;

unless either of the following conditions is fulfilled:

d. the state boundary is designated only in one or more dependences having a timing interval equal to zero, and which designate only state boundaries on the same signal that are not zero transitions; and e. the priority attributes of all dependences designating the state boundary are sufficiently low.

6. The method of claim 5 wherein a state boundary is replaced with the first transition of a transition state unless at least one of the following conditions is fulfilled:

a. the state boundary occurs in a clock signal pattern and at least one dependence designating the state boundary and a state boundary on a different signal has a positive timing interval and a maximum type designation or a negative timing interval and a minimum type designation;

b. the state boundary occurs in a clock signal pattern and is designated in at least one dependence that also designates a second state boundary that occurs in a non-clock signal, or the state boundary does not occur in a clock signal pattern but is designated in at least one dependence that also designates a second state boundary that occurs in a clock signal, and the state boundary occurs on a source signal of the at least one dependence and such dependence is a minimum type, or the state boundary occurs on a destination signal of the at least one dependence and such dependence is a maximum type; and c. the state boundary is designated in a dependence that also designates a second state boundary on the same signal, and i. the state boundary occurs later than the second state boundary and the dependence is a maximum type; or ii. the state boundary occurs earlier than the second state boundary and the dependence is a minimum type.

7. Apparatus for generating signal pattern and dependence information from a plurality of timing specifications, each specification including a classification, a reference to at least one signal, a time interval having magnitude and direction and a comparison expression, the apparatus comprising:

a. first memory means for storing a plurality of specifications;

b. second memory means, accessible by a user, for storing signal and pattern information; and c. processor means for i. analyzing the specifications to determine whether:

(A) any timing inconsistencies exist among the specifications, and if so, recording the identity of each specification with respect to which an inconsistency exists;

(B) if the specifications designate any clock signals, a valid period for each such clock signal is set forth, and if not, generating at least one additional specification to set forth such a valid period;

(C) if the specifications designate any clock signals, a valid pulse width for each such clock signal is set forth, and if not, generating at least one additional specifications to set forth such a valid pulse width;

ii. generating dependences from the specifications and storing the dependences in the second memory means, each dependence including a type designation, a permissible timing interval, designation of at least one location on at least one signal, and a priority attribute;

iii. resolving inconsistencies among dependences generated from specifications identified as inconsistent by lowering the priority attribute of at least one dependence; and iv. generating at least one signal pattern and storing the at least one signal pattern in the second memory means, each signal pattern comprising a sequence of transition states and non-transition states that are consistent with the dependences.

* * * * *